(12) United States Patent
Nogami et al.

(10) Patent No.: US 6,214,731 B1
(45) Date of Patent: Apr. 10, 2001

(54) COPPER METALIZATION WITH IMPROVED ELECTROMIGRATION RESISTANCE

(75) Inventors: Takeshi Nogami, Sunnyvale; Minh Van Ngo, Union City; Shekhar Pramanick, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/442,771

(22) Filed: Nov. 18, 1999

Related U.S. Application Data

(62) Division of application No. 09/047,438, filed on Mar. 25, 1998, now abandoned.

(51) Int. Cl.[7] .................................................. H01L 21/44
(52) U.S. Cl. ...................... 438/687; 438/627; 438/630; 438/643; 438/649; 438/653; 438/655; 438/660; 438/664; 438/678; 438/680; 438/683
(58) Field of Search .................................. 438/687, 627, 438/630, 643, 649, 653, 655, 660, 664, 678, 680, 683

(56) References Cited

U.S. PATENT DOCUMENTS

| | | | |
|---|---|---|---|
| 4,789,648 | * 12/1988 | Chow et al. ........................ | 438/633 |
| 5,447,887 | 9/1995 | Filipiak et al. ........................ | 438/651 |
| 5,635,423 | * 6/1997 | Huang et al. ........................ | 438/638 |
| 5,744,394 | 4/1998 | Iguchi et al. ........................ | 438/276 |
| 5,801,444 | 9/1998 | Aboelfotoh et al. .................. | 257/762 |
| 5,913,147 | 6/1999 | Dubin et al. ........................ | 438/687 |
| 5,918,150 | 6/1999 | Nguyen et al. ........................ | 438/687 |
| 5,933,758 | * 8/1999 | Jain ........................ | 438/687 |

OTHER PUBLICATIONS

"Formation, Oxidation, Electronic, and Electrical Properties of Copper Silicides", by Cros et al., Journal of Applied Physics, vol. 67, No. 7, Apr. 1, 1990; pp. 3328–3336.

* cited by examiner

*Primary Examiner*—Richard Booth
*Assistant Examiner*—Lynne A. Gurley

(57) ABSTRACT

Cu interconnection patterns with improved electromigration resistance are formed by depositing a barrier metal layer, such as W or WN, to line an opening in a dielectric layer. The exposed surface of the deposited barrier metal layer is treated with silane or dichlorosaline to form a thin silicon layer thereon. Cu is then deposited to fill the opening and reacted with the thin silicon layer to form a thin layer of Cu silicide at the interface between Cu and the barrier metal layer, thereby reducing the interface defect density and improving electromigration resistance.

11 Claims, 3 Drawing Sheets

COPPER METALIZATION WITH IMPROVED ELECTROMIGRATION RESISTANCE

This application is a Divisional of application Ser. No. 09/047,438 filed Mar. 25, 1998 now abandoned.

TECHNICAL FIELD

The present invention relates to semiconductor devices comprising copper or copper alloy interconnection patterns. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, normally of monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer can be removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line. In copending U.S Pat. No. 5,635,423, prior art single and dual damascene techniques are disclosed, in addition to several improved dual damascene techniques simultaneously forming a conductive line in electrical contact with a conductive plug for greater accuracy in forming fine line patterns with minimal interwiring spacings.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyimide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Copper (Cu) and Cu alloys have recently received considerable attention as a replacement material for Al in VLSI interconnect metallizations. Cu has a lower resistivity than Al, and has improved electrical properties vis-à-vis W, making Cu a desirable metal for use as a conductive plug as well as conductive wiring. However, Cu does not exhibit high electromigration resistance and readily diffuses through silicon dioxide, the typical dielectric interlayer material, and adversely affects the devices.

One conventional approach in attempting to form Cu plugs and wiring comprises the use of damascene structures employing CMP, as in Chow et al., U.S. Pat. No. 4,789,648. However, due to Cu diffusion through the dielectric interlayer, Cu interconnect structures must be encapsulated by a diffusion barrier layer. Typical diffusion barrier metals include tantalum (Ta), tantalum nitride (TaN), titanium nitride (TiN), titanium tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

Accordingly, there exists a need for Cu metalization technology with improved electromigration resistance. There exists a particular need for methodology implementing electromigration resistant Cu interconnect patterns by voidlessly filling high aspect ratio openings.

DISCLOSURE OF THE INVENTION

An object of the present invention is a Cu or Cu alloy interconnection pattern exhibiting improved electromigration resistance.

Another object of the present invention is a method of manufacturing a semiconductor device having a reliable Cu or Cu alloy interconnection pattern with improved electromigration resistance.

Additional objects, advantages and other features of the invention will be set forth in the description which follows and in part will be apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device having an interconnection pattern comprising: a dielectric layer having an opening therein; and a composite metal layer filling the opening, the composite metal layer comprising: a barrier metal layer lining the opening; a layer of Cu silicide on the barrier metal layer; and a layer of Cu or a Cu alloy on the Cu silicide layer filling the opening.

Another object of the present invention is a method of manufacturing a semiconductor device, the method comprising forming an opening in a dielectric layer: depositing a barrier metal layer lining the opening and having an exposed surface; forming a layer of silicon on the barrier metal layer; and depositing a layer of Cu or a Cu alloy on the silicon layer and filling the opening, wherein Cu in the deposited Cu or Cu alloy layer reacts with the silicon layer to form a layer of Cu silicide between the barrier metal layer and the Cu or Cu alloy layer.

Additional objects and advantages of the present invention will become readily apparent to those skilled in this art from the following detailed description, wherein embodiments of the invention are described simply by way of illustrating the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature and not as restrictive.

DESCRIPTION OF THE INVENTION

Figure 1A:
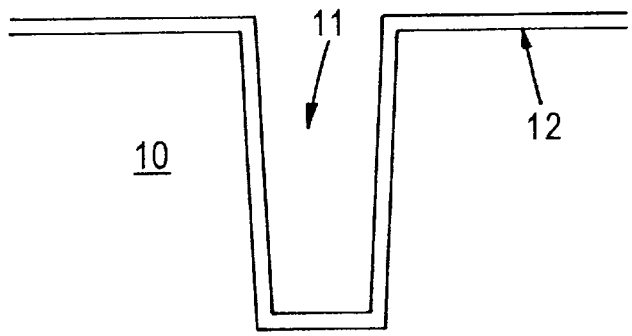
FIGS 1A–1D schematically illustrate sequential phases of a method in accordance with an embodiment of the present invention of embodiments.
Figure 1B:
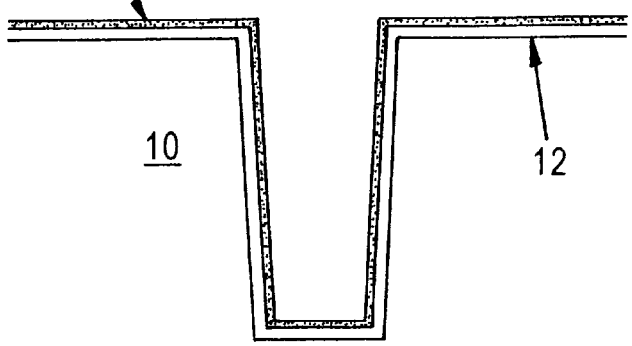
Figure 1C:
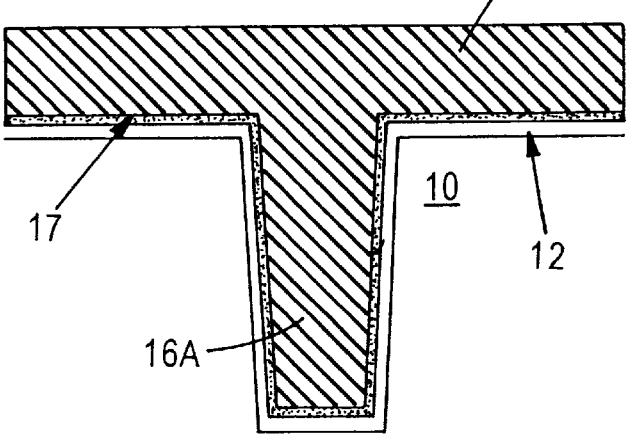
Figure 1D:
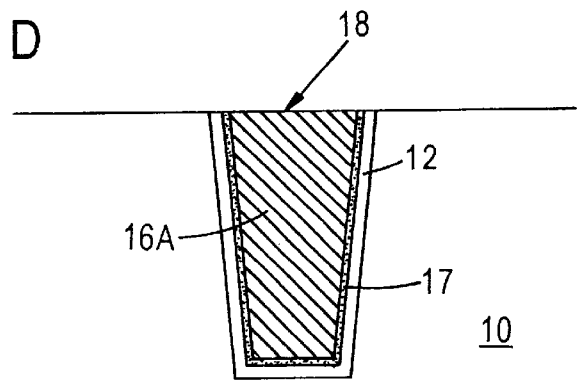

The present invention addresses and solves the poor electromigration resistance problem of Cu metallization in a cost effective and efficient manner. The present invention enables the use of Cu metallization in forming interconnect patterns as well as the use of electroplating and electroless plating techniques to fill high aspect ratio openings, e.g. aspect ratio openings in excess of 3:1. As employed throughout the application, Cu is intended to encompass elemental Cu as well as Cu-based alloys substantially exhibiting the electrical properties of Cu, such as Cu alloys containing minor amounts of silicon and/or Al.

In various embodiments of the present invention, Cu metallization exhibiting improved electromigration resistance is achieved by initially depositing a barrier metal layer in an opening formed in a dielectric layer, such as silicon dioxide. The barrier metal layer can comprise any of the barrier materials typically employed for that purpose, such as Ta, TaN Titanium (Ti), Titanium silicon nitride, TiN, TiW, W, W-alloys and tungsten nitride (WN). Particularly suitable results have been achieved by depositing a barrier metal layer of W, a W-alloy or WN by chemical vapor deposition in atmosphere of silane or dichlorosilane. The barrier metal layer is deposited at a suitable thickness, such as about 50 Å to about 200 Å, e.g., about 50 Å to about 100 Å.

In accordance with an embodiment of the present invention, after depositing the barrier metal layer, such as W, the surface of the deposited W is treated by exposure to silane ($SiH_4$) gas or dichlorosilane ($SiCl_2H_2$) gas to form a thin layer of silicon on the upper surface of the barrier metal layer lining the opening. Exposure of the surface of the W layer lining the through hole to $SiH_4$ or $SiCl_2H_2$ is typically implemented at a temperature of about 300° C. to about 500° C., e.g., about 350° C. to about 400° C., for about 30 seconds to about 30 minutes e.g., about 30 seconds to about 5 minutes. The thickness of the deposited silicon layer formed on the barrier metal layer is preferably very thin, such as about 10 Å to about 100 Å, e.g., about 20 Å to about 90 Å. Subsequently, Cu is deposited by CVD, electroplating or electroless plating to fill the opening and form a layer on the upper surface of the dielectric layer.

If the exposed surface of the barrier metal layer was treated with $SiH_4$ or $SiCl_2H_2$ at a temperature above 400° C., Cu in the deposited layer reacts with the thin silicon layer to form a thin layer of Cu silicide at the interface between the deposited Cu layer and the barrier metal layer. If the exposed surface of the barrier metal layer was treated with $SiH_4$ or $SiCl_2H_2$ at a temperature less than about 400° C., heat treatment is conducted, after depositing the Cu layer, to effect reaction between Cu in the deposited Cu layer and the silicon layer to form the thin layer of Cu silicide, as at a temperature of about 350° C. to about 400° C. for about 10 minutes to about 60 minutes. The thin layer of Cu silicide has a relatively low defect density, thereby providing high electromigration resistance to the Cu filling the opening.

Openings formed in accordance with the present invention can be implemented by damascene techniques, including dual damascene techniques. The openings formed in the dielectric layer can be via holes which are filled with Cu to form a via interconnecting upper and lower metal lines, or a contact hole in which case the Cu filled hole electrically connects a first metal level line with a source/drain region in a semiconductive substrate. The opening in the dielectric layer can also be a trench, in which case the filled trench forms an interconnection line. The opening can also be formed by dual damascene techniques, in which case a via/contact communicating with a line is simultaneously formed by Cu deposition.

An embodiment of the present invention is illustrated in FIGS. 1A–1D, wherein similar features bear similar reference numerals. Adverting to FIG. 1A, an opening 11 is formed in dielectric layer 10 and a barrier metal layer 12, such as W, a W-alloy or WN, is deposited to form a thin barrier metal layer 12 on the upper surface of dielectric layer 10 and lining the internal exposed surface of opening 11. The surface of the barrier metal layer 12 is then treated with $SiH_4$ or $SiCl_2H_2$ at an elevated temperature, indicated by arrow 13 in FIG. 1B, to form a thin layer of silicon 14 on barrier metal layer 12, including within opening 11. Cu is then deposited, as by CVD, PVD, electroplating or electroless plating, as indicated by arrow 15 in FIG. 1C, to fill the opening 11 with Cu 16A and form a layer of Cu 16B on the dielectric layer 10. If the $SiH_4$ or $SiCl_2H_2$ treatment of the barrier metal layer surface is conducted at a temperature greater than about 400° C., Cu in the deposited Cu layer reacts with the thin silicon layer 14 to form a layer of Cu silicide 17, (e.g. $CuSi_2$) at the interface between the barrier metal layer 12 and the deposited Cu 16A, 16B. If the $SiH_4$ or $SiCl_2H_2$ treatment of the barrier metal layer surface is conducted at a temperature less than about 400° C., heat treatment is conducted after Cu deposition, to effect reaction between Cu in the deposited Cu layer and the silicon layer 20 to form the thin Cu silicide layer, e.g. at about 350° C. to about 400° C. for about 10 minutes to about 60 minutes.

Subsequently, CMP is performed so that the upper surface 18 of the Cu filled opening is substantially coplanar with the upper surface of dielectric layer 10. The resulting interconnection comprises a opening, such as a trench, filled with a barrier metal layer 12, a layer of Cu silicide 17 on barrier metal layer 12, and Cu 16A filling the trench.

Figure 2A:
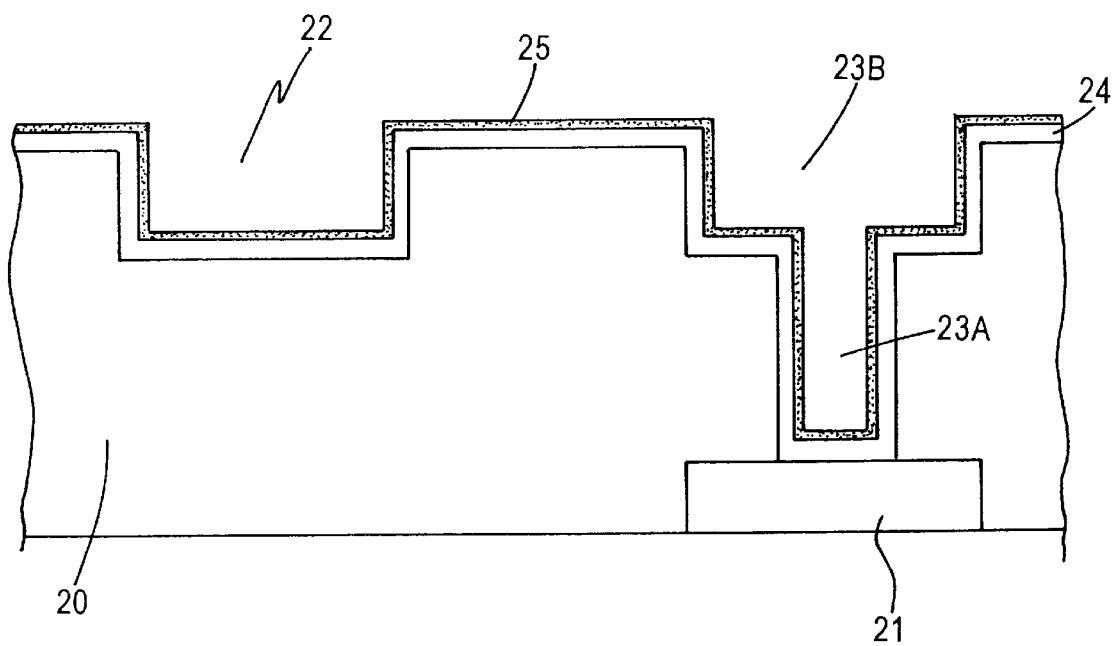
FIGS. 2A–2C illustrates sequential phases of a method in accordance with another embodiment of the present invention.
Figure 2B:
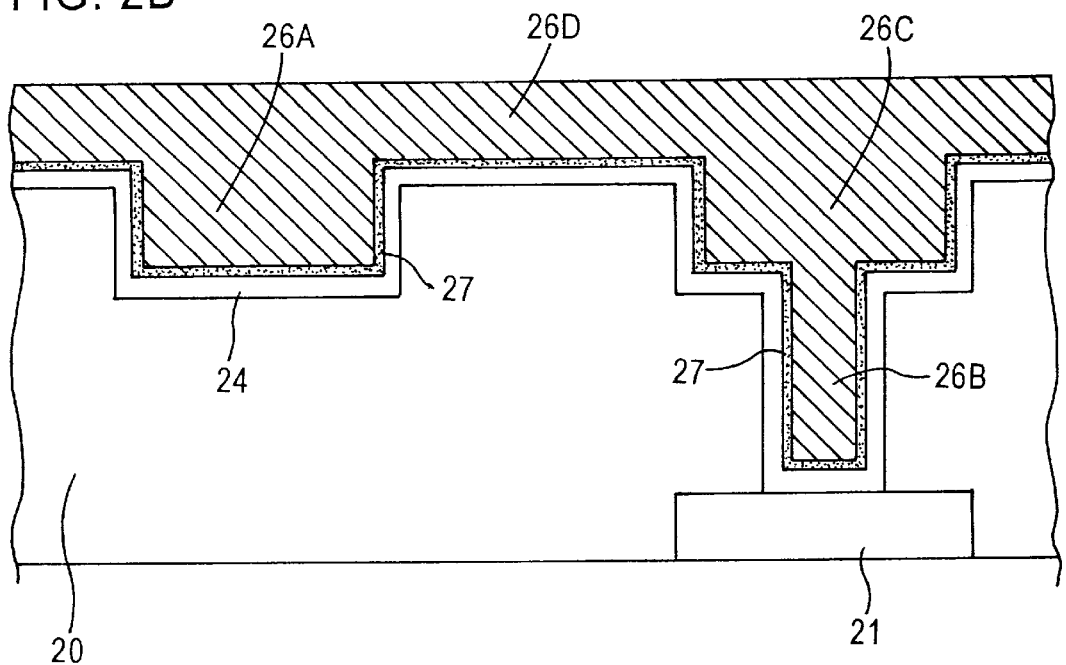
Figure 2C:
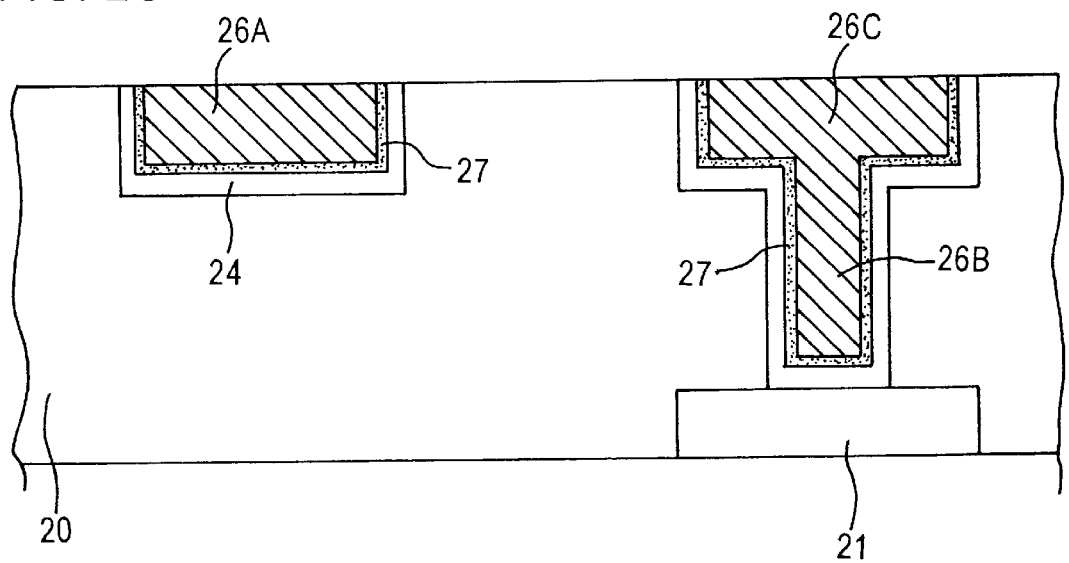

Another embodiment of the present invention is schematically illustrated in FIGS. 2A–2C, wherein similar features bear similar reference numerals. This embodiment illustrates the formation of a trench with via by a dual damascene technique. Adverting to FIG. 2A, a trench opening 22 and a dual damascene opening comprising a via hole 23A and trench 23B communicating with via hole 23A are formed in dielectric layer 20. A barrier metal layer 24 is deposited, as by CVD, to line the trench 22 and the dual damascene opening 23A, 23B. The surface of barrier metal layer 24 is treated with $SiH_4$ or $SiCl_2H_2$ at a temperature of about 400° C. to form a thin layer of silicon 25 on barrier metal layer 24.

Adverting to FIG. 2B, Cu is then deposited to fill trench opening 22 and damascene opening 23A, 23B. Cu filling trench 22 is designated by reference numeral 26A, Cu filling via hole 23A is designated by reference numeral 26B and Cu filling trench opening 23B is designated by reference numeral 26B. An upper layer of Cu 26D is also formed on dielectric layer 10. As silicon layer 25 was formed at a temperature greater than about 400° C., silicon layer 25 is normally at a sufficiently high temperature so that Cu in the deposited Cu layer reacts with silicon layer 25 to form a layer of Cu silicide 27 at the interface between barrier metal layer 24 and the Cu metallization. Subsequently, CMP is performed to provide a planarized upper surface, as shown in FIG. 2C.

It was found particularly effective to deposit a barrier layer of W, a W-alloy or WN by CVD in an atmosphere of $SiH_4$ or $SiCl_2H_2$ gas. Subsequent treatment of the deposited barrier layer with $SiH_4$ or $SiCl_2H_2$ can be implemented in the same tool employed for barrier metal deposition, thereby increasing manufacturing efficiency and throughput.

The present invention provides cost effective efficient methodology to form reliable Cu metallization with improved electromigration resistance. The present invention can be employed in manufacturing various types of semiconductor devices, particularly semiconductor devices having submicron features and high aspect ratio openings.

In the previous description, numerous specific details are set forth, such as specific materials, structures, chemicals, processes, etc, in order to provide a better understanding of the present invention. However, the present invention can be practiced without resorting to the details specifically set forth. In other instances, well known processing structures have not been described in order not to unnecessarily obscure the present invention.

Only the preferred embodiment of the invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of manufacturing a semiconductor device, the method comprising:
    forming an opening in a dielectric layer:
    depositing a barrier metal layer lining the opening and having an exposed surface;
    treating the exposed surface of the barrier layer with silane or dichlorosilane to form a layer of silicon at a thickness of about 10 Å to about 100 Å, on the barrier metal layer; and
    depositing a layer of copper or a copper alloy on the silicon layer and filling the opening, wherein copper in the deposited layer reacts with the silicon layer to form a layer of copper silicide between the barrier metal layer and the copper or copper alloy layer.

2. The method according to claim 1, wherein the barrier metal layer comprises a material selected from the group consisting of tantalum, tantalum nitride, titanium, titanium nitride, titanium silicon nitride, titanium-tungsten, tungsten, a tungsten alloy and tungsten nitride.

3. The method according to claim 1, comprising, treating the exposed surface of the barrier metal layer with silane or dichlorosilane at a temperature of about 300° C. to about 500° C. for about 30 seconds to about 30 minutes.

4. The method according to claim 3, comprising:
    treating the exposed surface of the barrier metal layer with silane or dichlorosilane at a temperature greater than about 400° C. wherein, copper in the deposited copper or copper alloy layer reacts with the silicon layer to form the layer of copper silicide.

5. The method according to claim 1, comprising, treating the exposed surface of the barrier metal layer with silane or dichlorosilane at a temperature of about 300° C. to about 400° C. for about 30 seconds to about 5 minutes; and, after depositing the copper or copper alloy layer, heat treating at a temperature of about 350° C. to about 400° C. for about 10 minutes to about 60 minutes, wherein copper in the deposited copper or copper alloy layer reacts with the silicon layer to form the layer of copper silicide.

6. The method according to claim 1, comprising forming the silicon layer at a thickness of about 20 Å to about 90 Å.

7. The method according to claim 1, wherein the barrier metal layer comprises a material selected from the group consisting of tungsten, a tungsten alloy and tungsten nitride.

8. The method according to claim 7, comprising depositing the barrier metal layer by chemical vapor deposition in an atmosphere comprising silane or dichlorsilane.

9. The method according to claim 8, comprising depositing the barrier metal layer and treating the surface of the barrier metal layer with silane and dichlorsilane in the same tool.

10. The method according to claim 1, comprising:

depositing the copper or copper alloy layer by chemical vapor deposition, physical vapor deposition, electroplating or electroless plating and;

chemical-mechanical polishing so that an upper surface of the copper or copper alloy layer is substantially coplanar with an upper surface of the dielectric layer.

11. The method according to claim 1, wherein the opening is a dual damascene opening comprising a lower via opening in communication with an upper trench.

* * * * *